US009786534B2

(12) United States Patent
Nakamura et al.

(10) Patent No.: US 9,786,534 B2
(45) Date of Patent: Oct. 10, 2017

(54) EFEM

(71) Applicant: SINFONIA TECHNOLOGY CO., LTD., Tokyo (JP)

(72) Inventors: Hiroaki Nakamura, Tokyo (JP); Toshiyuki Takaoka, Tokyo (JP); Yoshikatsu Takemoto, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 14/479,842

(22) Filed: Sep. 8, 2014

(65) Prior Publication Data

US 2015/0071739 A1    Mar. 12, 2015

(30) Foreign Application Priority Data

Sep. 9, 2013 (JP) .................................. 2013-185987

(51) Int. Cl.
*H01L 21/677*  (2006.01)
*H01L 21/67*   (2006.01)

(52) U.S. Cl.
CPC .. *H01L 21/67745* (2013.01); *H01L 21/67766* (2013.01); *H01L 21/67769* (2013.01); *H01L 21/67196* (2013.01)

(58) Field of Classification Search
CPC ......... H01L 21/67196; H01L 21/67742; H01L 21/68707; H01L 21/67748;

(Continued)

(56) References Cited

U.S. PATENT DOCUMENTS 5,611,655 A * 3/1997 Fukasawa ............. C23C 14/564
                                                    414/217
8,303,764 B2 * 11/2012 Bluck ............... H01L 21/67173
                                                    118/719

(Continued)

FOREIGN PATENT DOCUMENTS

JP    2001-274221 A    10/2001
JP    2005-268264 A     9/2005

(Continued)

OTHER PUBLICATIONS

English machine translation of Office Action dated Apr. 25, 2017, issued in Japanese Patent Application No. 2013-185987.

*Primary Examiner* — Glenn Myers
(74) *Attorney, Agent, or Firm* — Westerman, Hattori, Daniels & Adrian, LLP

(57) ABSTRACT

An EFEM 1 includes a wafer transfer chamber 3 having an interior space in which a wafer transfer robot 5 is disposed and load ports 2 disposed adjacent to a front surface 32 of the wafer transfer chamber 3, and semiconductor processing equipment M can be disposed adjacent to a rear surface 33 of the wafer transfer chamber 3. The EFEM 1 has a configuration in which two buffer stations 4 capable of temporarily storing wafers W are disposed next to each other in the front-rear direction A on a side surface 31 of the wafer transfer chamber 3. The EFEM 1 thus configured adapts to an increase in wafer diameter and is capable of handling many wafers while preventing or minimizing an increase in the stroke distance in the height direction of the wafer transfer robot 5 and an increase in the footprint of the entire EFEM 1.

15 Claims, 9 Drawing Sheets

(58) Field of Classification Search
CPC ......... H01L 21/67745; H01L 21/67778; H01L 21/67766; H01L 21/67769; H01L 21/67775; H01L 21/67763; H01L 21/681
See application file for complete search history.

(56) References Cited

U.S. PATENT DOCUMENTS

| | | | | |
|---|---|---|---|---|
| 8,419,341 | B2* | 4/2013 | Hoey | H01L 21/67173 118/719 |
| 8,731,698 | B2* | 5/2014 | Onodera | H01L 21/67196 700/100 |
| 2004/0016637 | A1* | 1/2004 | Yang | A23D 7/00 204/242 |
| 2005/0196254 | A1* | 9/2005 | Kim | H01L 21/67017 414/217 |
| 2006/0219171 | A1* | 10/2006 | Sasaki et al. | 118/719 |
| 2007/0201156 | A1* | 8/2007 | Yamamoto et al. | 360/53 |
| 2008/0304952 | A1* | 12/2008 | Kondoh | H01L 21/67196 414/805 |
| 2010/0147327 | A1* | 6/2010 | Kondo et al. | 134/1 |
| 2011/0238201 | A1* | 9/2011 | Hiroki | H01L 21/67196 700/112 |
| 2012/0093620 | A1* | 4/2012 | Murata et al. | 414/281 |
| 2012/0247671 | A1* | 10/2012 | Sugawara | 156/345.31 |
| 2015/0059978 | A1* | 3/2015 | Park | C23C 16/04 156/345.24 |
| 2015/0071737 | A1* | 3/2015 | Hofmeister | B25J 9/042 414/217 |

FOREIGN PATENT DOCUMENTS

| | | |
|---|---|---|
| JP | 2008-27937 A | 2/2008 |
| JP | 2012-114456 A | 6/2012 |

* cited by examiner

EFEM

BACKGROUND OF THE INVENTION

Field of the Invention

The present invention relates to an Equipment Front End Module (EFEM) including a wafer transfer chamber, load ports, and buffer stations.

Description of Related Art

In semiconductor manufacturing processes, wafers are handled in a cleanroom in order to achieve high yields and high quality. In current circumstances of the increase in device packaging density, the downscaling of circuit features, and the increase in wafer sizes, it is, however, difficult to control fine dust in an entire clean room both technically and costwise. Instead of improving cleanliness in the entire cleanroom, the "minienvironment system" for improving the cleanliness only in a local space around wafers has, therefore, been recently introduced into tools for performing processes including a wafer transfer process. An Equipment Front End Module (EFEM) plays a key role in the minienvironment system. The EFEM is a module in which a load port that can load thereon a container or so-called Front-Opening Unified Pod (FOUP) for transferring and storing wafers in an ultra clean environment and a wafer transfer chamber are adjacently disposed in the front-rear direction of the wafer transfer chamber.

The EFEM is configured so that a door part of the load port and a door provided on the front surface of the FOUP are in close contact and opened simultaneously, and so that a wafer transfer robot provided in the wafer transfer chamber can unload wafers from the FOUP and store the wafers in the wafer transfer chamber or can store the wafers unloaded from the wafer transfer chamber in the FOUP through the load port.

The load port is disposed in front of the wafer transfer chamber and the wafers transferred from the FOUP into the wafer transfer chamber by the wafer transfer robot through the load port undergo various processes and working in semiconductor processing equipment disposed in back (rear) of the wafer transfer chamber and are then stored again in the FOUP back from the wafer transfer chamber through the load port.

A configuration is also known in which a buffer station on which wafers can be temporality placed is disposed on a side surface of the wafer transfer chamber with the aim of improving the wafer handling capacity of the whole EFEM (see Japanese Patent Laid-Open No. 2008-27937). An interior space of the buffer station in which a plurality of wafers can be stacked at a predetermined pitch in a height direction communicates with the interior space of the wafer transfer chamber. The wafer transfer robot disposed in the wafer transfer chamber can store wafers in the interior space of the buffer station or can unload the wafers from the interior space of the buffer station. The configuration in which such a buffer station is disposed on each side surface of the wafer transfer chamber would allow more wafers to be stored than a configuration in which a buffer station is disposed at only on one side surface of the wafer transfer chamber.

The number of wafers that one buffer station can store is limited by the size of the buffer station. There are demands from EFEM installed plants for handling as many wafers as possible in a single EFEM. In order to meet the demands, it is conceivable to increase the height dimension of each buffer station to increase the storage space of the buffer station, thereby increasing the number of wafers that the buffer station can store.

However, the larger the height of a buffer station, the longer the up-down stroke (vertical travel distance) of the wafer transfer robot, which disadvantageously increases the size of the wafer transfer robot. The increase in the size of the wafer transfer robot causes an increase in the size of the wafer transfer chamber in which the wafer transfer robot is disposed inside and an increase in the footprint (installation area) of the whole EFEM. Therefore, it is desirable to avoid the increase in the size the wafer transfer robot as much as possible. Furthermore, the longer up-down stroke of the wafer transfer robot increases the time required for transferring each wafer unless the speed of operation of the wafer transfer robot is set higher than the conventional speed. Therefore it is not the best possible solution to increase the storage space of the buffer station in the height direction which entails the increase of the up-down stroke of the wafer transfer robot.

The size of wafers handled in the EFEM is standardized in the SEMI (Semiconductor Equipment and Materials International) standards. In order to improve productivity, the diameter of wafers has been increased and the transition from 300-mm-diameter (150-mm-radius) wafers to 450-mm-diameter (225-mm-radius) wafers is in progress. As the diameter of wafers increase, the weight per wafer increases. Accordingly, the strength of the wafer transfer robot needs to be enhanced. The strength of the wafer transfer robot may be enhanced by increasing the size of the wafer transfer robot.

However, as described above, it is desirable to minimize the increase in the size of wafer transfer robot which entails the increase of the footprints. There are demands from EFEM installed plants for handling 450-mm-diameter wafers with wafer transfer robots that conform to the same or substantially the same specifications as those for conventional wafer transfer robots that can transfer 300-mm-diameter wafers.

Note that the distance between adjacent wafers in the height direction (wafer slot pitch) when 450-mm wafers are stored in the FOUP or buffer station in the height direction according to the SEMI standards is set to a value greater than the wafer slot pitch adopted when 300-mm wafers are stored. The height dimension required for storing the 450-mm-wafers is larger than that required for storing the 300-mm wafers if the number of wafers is the same. To provide the wafer slot pitch as described above, it is inevitable from a design viewpoint to extend the storage space of the buffer station in the height direction. However, it is desirable to avoid increasing the height dimension of the buffer station due to reasons other than the wafer slot pitch. This is because the increase of the height dimension possibly causes the increase in the size of the wafer transfer robot and the increase in the footprint as described above.

The present invention has been made in light of these problems and a primary object of the present invention is to provide an EFEM that has a configuration capable of preventing or minimizing an increase in the up-down stroke distance of a wafer transfer robot (increase in the size of the wafer transfer robot) and an increase in the footprint of a whole EFEM and yet is capable of handling many wafers while adapting to an increase in the diameter of wafers.

SUMMARY OF THE INVENTION

The present invention relates to an EFEM including a wafer transfer chamber having an interior space in which a wafer transfer robot disposed is disposed, a load port disposed adjacent to the front surface of the wafer transfer chamber, and buffer stations capable of temporarily storing wafers, wherein semiconductor processing equipment can be displaced adjacent to the rear surface of the wafer transfer chamber. Here, the EFEM according to the present invention includes at least a wafer transfer chamber, a load port, and buffer stations. The semiconductor processing equipment does not constitute the EFEM of the present invention.

The EFEM according to the present invention is characterized in that two buffer stations are disposed next to each other in the front-rear direction of the wafer transfer chamber on at least one of both side surfaces of the wafer transfer chamber. The "front-rear direction of the wafer transfer chamber" herein refers to the direction in which the front and rear surfaces of the wafer transfer chamber are opposed to each other and is synonymous with the depth direction of the wafer transfer chamber.

In the EFEM according to the present invention, the use of the novel layout in which two buffer stations are disposed next to each other in the front-rear direction on at least one of the both side surfaces of a wafer transfer chamber as described above allows a single EFEM to store more wafers in buffer stations and can avoid an increase of the up-down stroke distance of a wafer transfer robot which would cause an increase in the size of the wafer transfer robot, because the storage space of the buffer stations does not need to be increased in the height direction according to an increase in the number of wafers that one buffer station can store, for example. Furthermore, since the EFEM according to the present invention has a configuration in which two buffer stations are disposed next to each other on each side surface of the wafer transfer chamber, the footprint of the configuration is correspondingly larger than the footprint of a configuration in which only one buffer station is disposed on one side surface but the configuration of this invention is advantageous in that the configuration does not cause an increase in the size of wafer transfer robot and an increase in the size of the wafer transfer chamber as compared with a configuration in which the storage space of a buffer station in the height direction is increased in order to store a larger number of wafers. In addition, in the EFEM of the present invention, the size of each of the two buffer stations disposed next to each other can be set to be the same or substantially the same as the size of a well-known buffer station. In that case, a wafer transfer robot and a wafer transfer chamber conforming to well-known specifications can be used, which is also advantageous over the configuration in which the buffer station has an increased height dimension.

Note that as the wafer size increases, the pitch of wafers in the height direction (the wafer slot pitch) stored in a buffer station is required to be increased in order to conform to the SEMI standards and the height of the buffer station would need to be increased correspondingly. With the EFEM according to the present invention, an increase of the height dimension of the buffer station in order to meet the requirements other than the wafer slot pitch requirement (specifically, a requirement that the number of wafers that a buffer station can store be increased to twice the number of wafers that a conventional buffer station can store) can be avoided.

Furthermore, in EFEM according to the present invention, the number of buffer stations disposed next to each other on one of the side surfaces of the wafer transfer chamber is limited to two. This is because a layout in which three or more buffer stations are disposed next to each other on a side surface of the wafer transfer chamber takes a larger space for the buffer stations disposed in the front-rear direction to increase the footprint of the EFEM and increases complexity of control over loading and unloading (delivery and retrieval) of wafers by a common wafer transfer robot, for example, to and from the three or more buffer stations disposed next to each other and handling of cabling associated with the wafer transfer robot as compared with the mode in which the two buffer stations are disposed next to each other.

In particular, the EFEM according to the present invention uses a wafer transfer robot that has an arm capable of moving a hand provided at an end of the arm back and forth and a traveling part which turnably supports the base end of the arm and is configured to travel in the direction of the width of the wafer transfer chamber. The wafer transfer robot is configured to move the hand back and forth along the linear motion path from a predetermined position on a travel path of the traveling part to each buffer station. This configuration reduces the motion distance of the hand and the time required for loading and unloading wafers to and from the buffer station as compared with a configuration in which the hand crookedly follow a linear motion path along the front-rear direction (the depth direction) of the wafer transfer chamber and a linear motion path parallel to the travel path of the traveling part (the direction of the width of the wafer transfer chamber) in turn to access each buffer station.

The motion paths of the hand to the two buffer stations disposed next to each other are preferably set so that two straight lines coinciding with the motion paths cross a straight line that coincides with the travel path of the traveling part at a common position. However, the motion paths may be set so that the two straight lines cross the straight line at different positions.

The EFEM according to the present invention may have a configuration in which two buffer stations are disposed next to each other only on one of the side surfaces of the wafer transfer chamber and buffer stations are not disposed on the other side surface or a configuration in which two buffer stations are disposed on one of the side surfaces of the wafer transfer chamber and one buffer station is disposed on the other side surface. However, the configuration in which two buffer stations are disposed next to each other in the front-rear direction on each of the both side surfaces of the wafer transfer chamber is advantageous in that the number of wafers that the EFEM can hold can be maximized.

Typically, an aligner for alignment of wafers is disposed on one side surface of the wafer transfer chamber of an EFEM. In the EFEM according to the present invention, an aligner can be disposed on one of the side surfaces of the wafer transfer chamber. In this case, the aligner is preferably disposed in a position where the aligner does not interfere with the buffer stations. The aligner can be disposed on one of the side surfaces of the wafer transfer chamber in both of: the configuration in which buffer stations are disposed only on one side surface of the wafer transfer chamber (a first layout) and the configuration in which buffer stations are disposed on both side surfaces of the wafer transfer chamber (a second layout).

In the first layout, the footprint of the EFEM can be minimized by disposing the two buffer stations on one of the side surfaces of the wafer transfer chamber and disposing the aligner below the buffer stations. Alternatively, disposing the two buffer stations on one side surface of the wafer transfer chamber and disposing the aligner on the other side surface in a position within the range of the height of the buffer stations can minimize the range of the movement of the wafer transfer robot in the height direction to avoid the need for increasing the size of the motor that drives the wafer transfer robot up and down. Thus an increase of the wafer transfer robot and consequently the size of the wafer transfer chamber can be avoided.

In the second layout, disposing the aligner below the buffer stations on one of the side surfaces of the wafer transfer chamber can minimize an increase in the footprint of the EFEM while providing the maximum wafer holding capacity. In this case, all of the buffer stations disposed on both side surfaces of the wafer transfer chamber can be set at the same height positions or the buffer stations disposed on the same side surface as the aligner can be set at a height position different from that of the buffer stations disposed on the other side surface.

The present invention can provide an EFEM that employs a novel layout in which two buffer stations are disposed next to each other in the front-rear direction on at least one of the side surfaces of a wafer transfer chamber to enable an increase of the total wafer holding capacity of the buffer stations in the whole EFEM while adapting to an increase in the diameter of wafers. The layout can avoid increasing the up-down stroke distance of a wafer transfer robot and increasing the size of the wafer transfer robot itself due to an increase in the height dimension of buffer stations and can minimize an increase in the footprint of the EFEM.

DESCRIPTION OF THE PREFERRED EMBODIMENTS

One embodiment of the present invention will be described below with reference to drawings.

Figure 1:
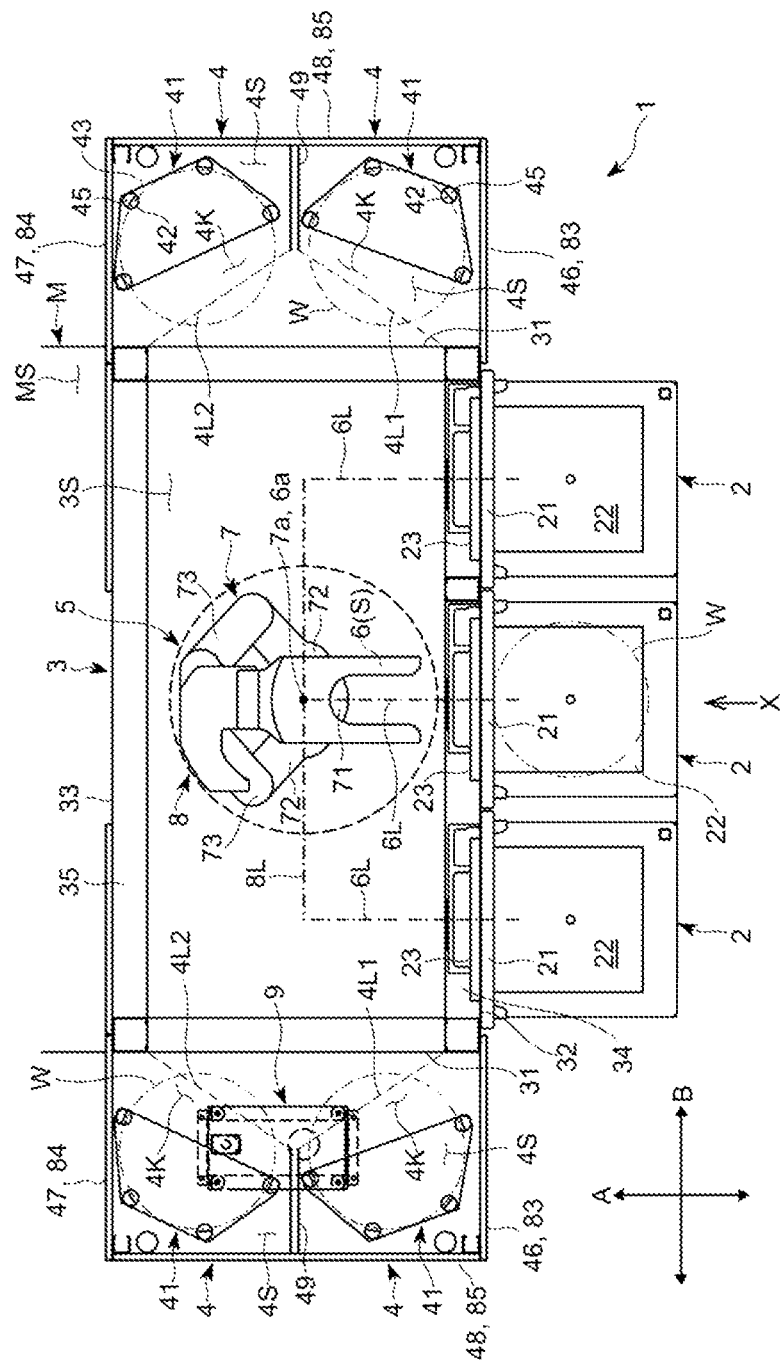
FIG. 1 is a plan view schematically illustrating the relative positional relationship between an EFEM according to one embodiment of the present invention and its peripheral equipment.
Figure 2:
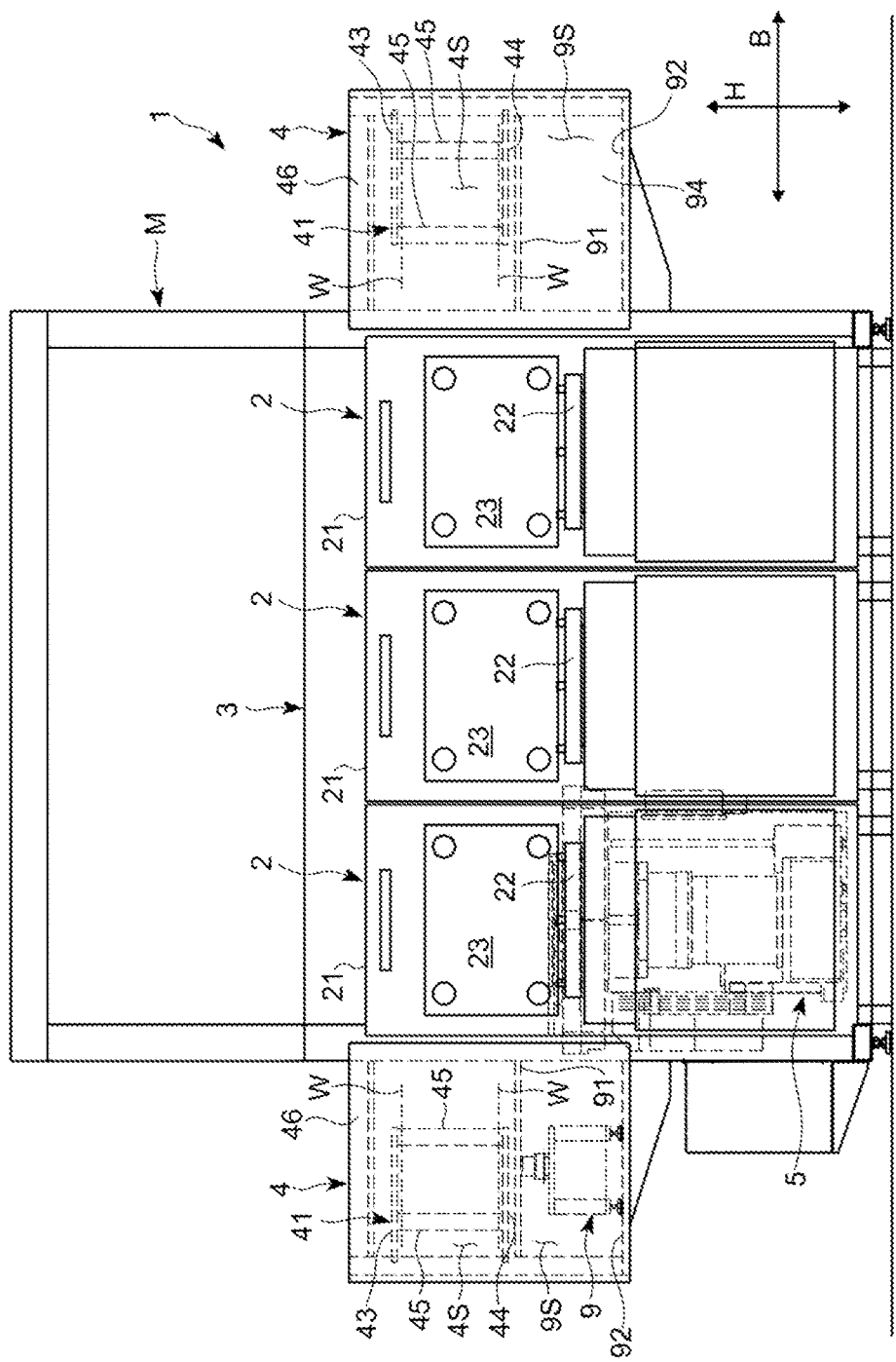
FIG. 2 is an arrow view in an X direction in FIG. 1.

As illustrated in FIG. 1, an EFEM 1 according to one embodiment mainly include load ports 2, a wafer transfer chamber 3 and buffer stations 4, which are provided adjacent to each other in a common clean room. Wafer processing equipment M (which represents "semiconductor processing equipment M" in the present invention), for example, is disposed adjacent to a rear surface 33 (back surface) of the wafer transfer chamber 3. The inside MS of the wafer processing equipment, the inside 3S of the wafer transfer chamber, the inside 4S of the buffer stations, and the inside the wafer containers (FOUPs) placed on the load ports 2 are kept ultra clean, in other words, the outside of the wafer processing equipment M, the wafer transfer chamber 3 and the buffer stations 4 is at a relatively low cleanliness level while the space in which the load ports 2 are disposed. Note that FIG. 1 is a plan view schematically illustrating the relative positional relationship among the load ports 2, the wafer transfer chamber 3 and the buffer stations 4 and the relative positional relationship of the EFEM 1 including the load ports 2, the wafer transfer chamber 3 and the buffer stations 4 with the semiconductor processing equipment M and FIG. 2 is a schematic diagram of the EFEM 1 and the semiconductor processing equipment M viewed from the X direction in FIG. 1.

The load ports 2 are provided adjacent to a front surface 32 of the wafer transfer chamber 3. Each of the load ports 2 is used for loading and unloading wafers W between the front-opening unified pod (FOUP) (not shown) in which a plurality of wafers W can be stacked one above another in the height direction H and the wafer transfer chamber 3 by opening and closing the door of the FOUP in close contact with the load port 2. The load port 2 includes a frame 21 having the shape of a substantially rectangular plate and disposed vertically, a table 22 provided substantially horizontally on the frame 21, and a door part 23 which closes and opens an opening which has an lower edge at the frame 21 at the substantially the same height as the table 22 and can communicate with the inside 3S of the wafer transfer chamber. A bottom purge unit that can inject purge gas into the FOUP to replace gaseous atmosphere in the FOUP with the purge gas such as nitrogen gas can be provided in the load port 2. A plurality of (three in the depicted example) such load ports 2 are arranged at the front surface 32 of the wafer transfer chamber 3 of the EFEM 1 according to the present embodiment. Each of the load ports 2 is configured to be capable of transferring an FOUP transferred by an FOUP carrier such as an over hoist transfer (OHT) running on a transfer line (track) on a straight line extending along the front surface 32 of the wafer transfer chamber 3 from above the load port 2 onto the table 22 and also capable of passing the FOUP holding wafers W that underwent a predetermined process by the wafer processing equipment M from the table 22 of the load port 2 to the FOUP carrier. The load ports 2 in the EFEM 1 of the present embodiment may be known load ports.

The wafer processing equipment M is disposed adjacent to the rear surface 33 (back surface) of the wafer transfer chamber 3 and includes a wafer processing equipment system disposed in a position relatively far from the wafer transfer chamber 3 and a load lock chamber disposed in a position relative close to the wafer transfer chamber 3. In the present embodiment, the load ports 2, the wafer transfer chamber 3 and the wafer processing equipment M are closely disposed in this order in the front-rear direction A of the EFEM 1 as illustrated in FIG. 1.

The wafer transfer chamber 3 has a wafer transfer robot 5 provided in its interior space 3S. The wafer transfer robot 5 is capable of transferring wafers W between the FOUP or a buffer station 4 and the wafer processing equipment M. FIG. 1 illustrates a state in which the wafer transfer robot 5 faces the center load port 2 among the three load ports 2 and FIG. 2 illustrates a state in which the wafer transfer robot 5 faces the load port 2 on the observer's left among the three load ports 2.

In the present embodiment, one wafer transfer robot 5 is disposed in the interior space 3S of the wafer transfer chamber 3. The wafer transfer robot 5 includes an arm 7 capable of moving a hand 6 provided at an end of the arm 7 along a linear motion path, and a traveling part 8 (body) which turnably supports an arm base 71 constituting the base end of the arm 7 and travels in the width direction B of the wafer transfer chamber 3.

As illustrated in FIGS. 1 and 3 to 8, the arm 7 includes the arm base 71 which is disposed on the top surface of the traveling part 8 and is horizontally turnable around an turning axis 7a, a first link element 72 having a base end turnably coupled to the arm base 71, a second link element 73 horizontally turnably coupled to an end of the first link element 72, and a hand 6 which is an end effector horizontally turnably coupled to an end of the second link element 73. The arm 7 has a link structure (a multijoint structure) which changes the shape between a folded state in which the arm length is minimum (see FIG. 1) and an extended state in which the arm length is larger than in the folded state (see FIG. 3). While the hand 6 is depicted as having a folk-like shape bifurcated at the end in FIG. 1 and some other figures, a hand 6 having other shape may be used, such as a substantially rectangular shape in a planar view, for example.

Figure 3:
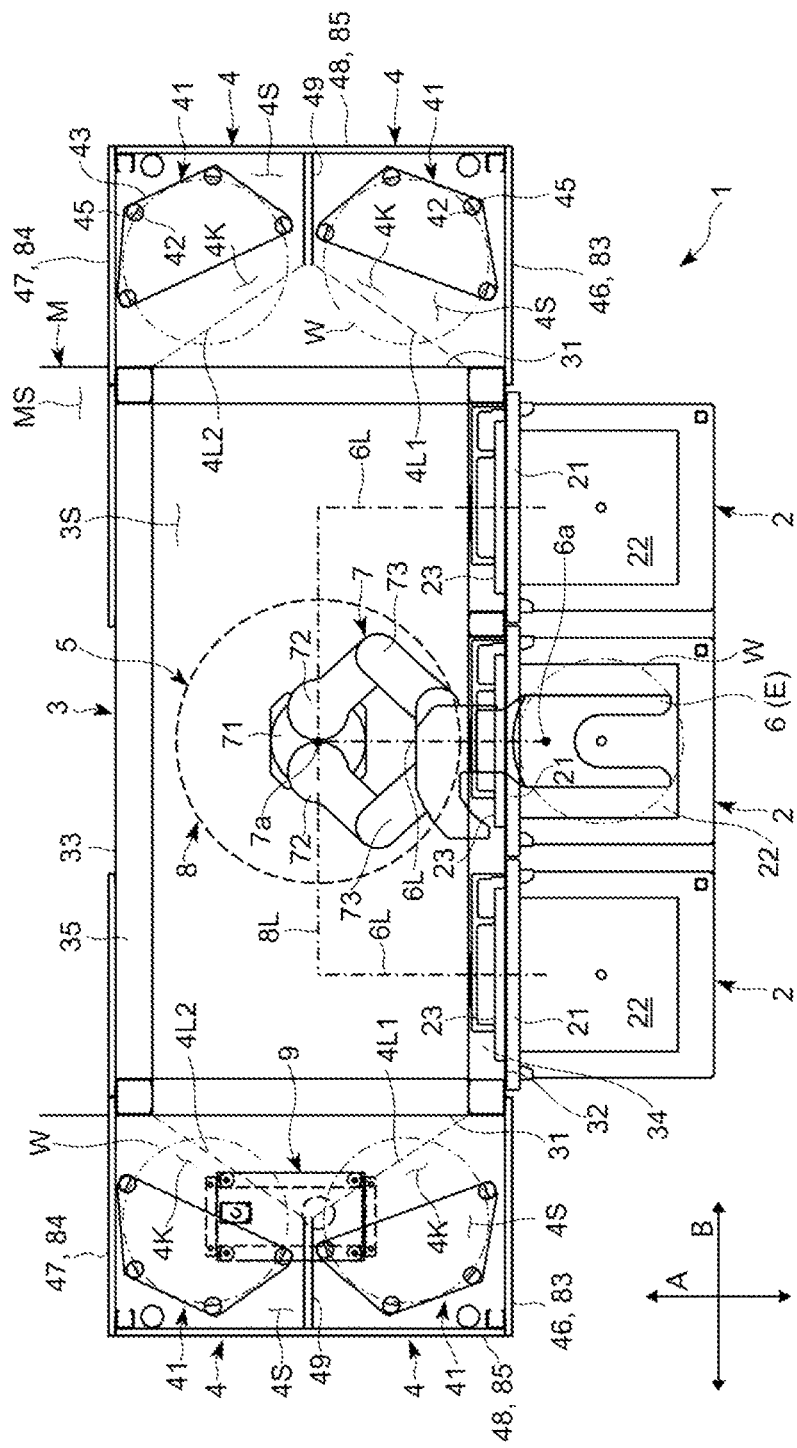
FIG. 3 is a diagram illustrating a state of the EFEM according to the embodiment in FIG. 1 in which a hand is moved into an FOUP on a load port.

The entire arm 7 can change the shape by horizontally turning the arm base 71, which is the base end, around the turning center axis 7a or by horizontally turning link elements 72, 73 at joints while moving the hand 6 from a motion start position (S) indicated in FIG. 1 and some other figures to a motion end position (E) indicated in FIG. 3 and some other figures to transfer a wafer W to a predetermined destination position. Note that while the arm 7 illustrated in FIG. 1 and other figures is of a two-hand type having two sets of a link mechanism (the first and second link elements 72, 73) and a hand 6 disposed on the common arm base 71 (the hands 6 overlap each other in the height direction), an arm that has only one set of a link mechanism and a hand may also be used. In the latter case, the arm base 70 may be omitted and the base end of the link element that is farthest from the hand in the extended state (which is equivalent to the first link element 72 in the present embodiment) may be attached to the traveling part 8 so that the base end can horizontally turn around the turning axis.

The traveling part 8 may be slidably movable on a slide rail (not shown) linearly extending along the width direction B of the wafer transfer chamber 3 on the floor of the wafer transfer chamber 3, for example. The traveling part 8 used in the present embodiment has a periphery having a substantially circular shape in a planar view and the center of the periphery coincides with the turning axis 7a of the arm 7 (the traveling part 8 is indicted by dashed circle in FIG. 1 and other figures). The travel path 8L of the traveling part 8 moving along the slide rail extends in the direction perpendicular to or substantially perpendicular to the front-rear direction A of the wafer transfer chamber 3. In FIGS. 1 and 3 and other figures, the path through which the center of the periphery of the traveling part 8, i.e. the turning axis 7a of the arm 7 passes when the traveling part 8 is moved is indicated as the travel path 8L of the traveling part 8 by dashed-dotted lines.

In the EFEM 1 of the present embodiment, a point that coincides with the turning axis 7a of the arm 7 in a planer view of the hand 6 positioned at the motion start position (S) when the arm 7 is folded is a hand reference point 6a. The trajectory of the hand reference point 6a moving when the traveling part 8 is moved along the travel path 8L with the arm 7 folded and the hand 6 positioned at the motion start position (S) coincides the travel path 8L of the traveling part 8.

Motions of the arm 7 and the traveling part 8 of the wafer transfer robot 5 according to the present embodiment are controlled by a controller (not shown).

In the present embodiment, wafers W can be loaded and unloaded between the FOUP on a load port 2 and the wafer transfer chamber 3 by moving the hand 6 back and forth along the front-rear direction A of the wafer transfer chamber 3 between the motion start position (S) and the motion end position (E) with the traveling part 8 of the wafer transfer robot 5 positioned and stopped at a location in the front-rear direction A of the wafer transfer chamber 3 that faces selected one of the plurality of load ports 2 disposed side by side on the front surface 32 of the wafer transfer chamber 3 (see FIGS. 1 and 3). In FIG. 1, the traveling part 8 is positioned at a location facing the center load port 2 among the three load port 2 disposed side by side and the hand 6 is at the motion start position (S). In FIG. 3, the hand 6 has been moved from the motion start position (S) to the motion end position (E) indicated in FIG. 1. In FIGS. 1 and 3, the motion path 6L of the hand 6 to each load port 2 is indicated by a dashed line. Note that the trajectory of the hand reference point 6a moving when the hand 6 is moved between the motion start position (S) and the motion end position (E) is considered the motion path 6L of the hand 6 in the present embodiment (the same applies to 6L1 and 6L2, which will be described later).

The EFEM 1 according to the present embodiment is configured to be able to transfer wafers W between the wafer transfer chamber 3 and the semiconductor processing equipment M (specifically, the load lock chamber) by linearly moving the hand 6 back and forth between the motion start position (S) and the motion end position (E) at which the hand 6 reaches the inside MS of the semiconductor processing equipment M with the traveling part 8 of the wafer transfer robot 5 positioned at a location facing the center load port 2 among the plurality of load ports 2 arranged in the width direction B and with the entire arm 7 turned around the turning axis 7a 180 degrees with respect to a reference angle of the arm 7 which is the orientation of the arm 7 illustrated in FIG. 1 (the orientation of the arm 7 in which the hand 6 can access the load port 2). That is, the EFEM 1 according to the present embodiment is capable of loading and unloading wafers to and from the wafer processing equipment M by the wafer transfer robot 5.

Furthermore, the EFEM 1 according to the present embodiment is configured to be able to load and unload wafers between a loading unit 41 of the buffer station 4 and the inside 3S of the wafer transfer chamber as illustrated in FIGS. 4 to 9. In the present embodiment, two buffer stations 4 are disposed next to each other on both side surfaces 31 of the wafer transfer chamber 3 in the front-rear direction A of the wafer transfer chamber 3. Thus, the EFEM 1 according to the present embodiment includes four buffer stations 4 in total.

Figure 7:
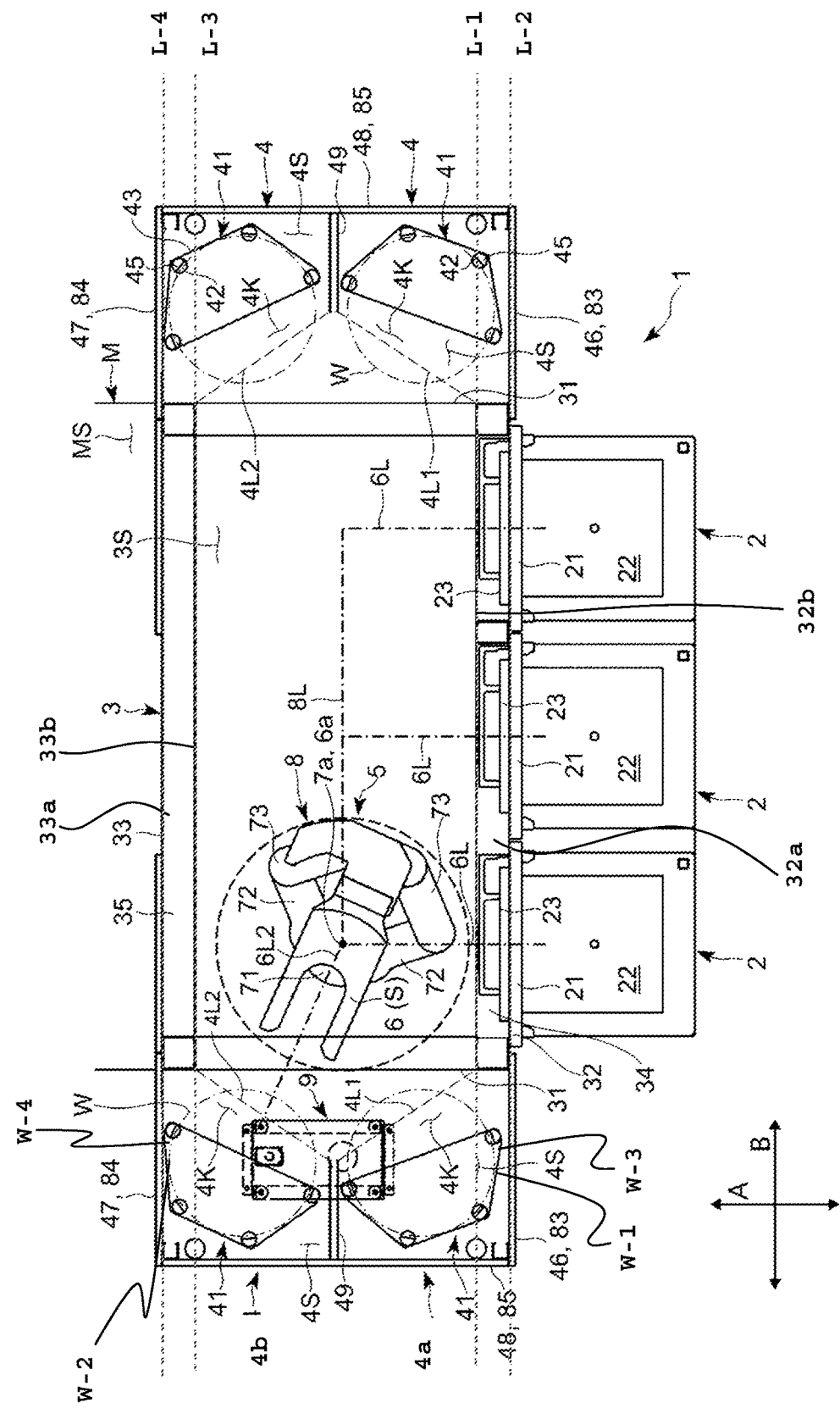
FIG. 7 is a diagram illustrating a state of the EFEM according to the embodiment in FIG. 1 in which the hand can access a rear buffer station.

Each buffer station 4 includes a loading unit 41 which has a plurality of wafer holding slots 42 in which a plurality of wafers W can be temporarily placed are formed in the height direction H at a predetermined pitch. As illustrated in FIGS. 1 and 2, the loading unit 41 of the present embodiment is configured by providing a plurality of pillars 45 between an top wall 43 and a bottom wall 44 that face each other in the height direction H and forming wafer holding slots 42 (cuts) at the predetermined pitch into which a portion of a wafer W can enter in each of the pillars 45 so that the wafer W can be held by the slots 42 at the same level. Note that only wafers W held at the top and bottom levels in the loading units 41 are depicted in FIG. 2 and the wafer holding slots 42 are omitted from FIG. 2. As one embodiment as shown in FIG. 7, the front wall 34 including the front surface 32 has a first inner surface 32*a* opposite to the front surface 32; and the rear wall 35 including the rear surface 33 has a second inner surface 33*a* opposite to the rear surface 33. As shown in FIG. 7, the front edge W-1 of the wafer is located in a position in front of a first line L-1 extended from the first inner surface 32*a* and behind a second line L-2 extended from the front surface 32, and the rear edge W-2 of the wafer is located in a position behind a third line L-3 extended from the second inner surface 33*a*, and in front of a fourth line L-4 extended from the rear surface 33. Alternatively, the front edge 41*a* of the first loading unit 41 is located in a position in front of a first line L-1 extended from the first inner surface 32*a* and behind a second line L-2 extended from the front surface 32; and the rear edge 41*b* of the second loading unit 41 is located in a position behind a third line L-3 extended from the second inner surface 33*a*, and in front of a fourth line L-4 extended from the rear surface 33.

In the present embodiment, the buffer stations 4 are configured to be able to hold wafers W having a diameter of 450 mm. The pitch between wafers W adjacent to each other in the height direction H (the wafer slot pitch) in the FOUP and each buffer station 4 is specified in the SEMI standards. The pith between the wafer holding slots 42 of each buffer station 4 in the present embodiment is chosen to be a predetermined value according to the SEMI standards. In the EFEM 1 according to the present embodiment, each buffer station 4 can hold up to 25 wafers W. The four buffer stations 4 can hold up to 100 wafers W in total. The number of wafers W that one buffer station 4 can hold can be set as appropriate. However, the height dimension of each buffer station 4 increases with the number of wafers W that the buffer station 4 can the hold. Since the wafer slot pitch between 450 mm-diameter wafers W specified in the SEMI is greater than the wafer slot pitch between 300 mm-diameter Wafers W as stated previously, the holding space needs to be increased in the height direction H by an amount equivalent to the increase in wafer slot pitch in order to configure the buffer station 4 to hold the same number of 450 mm-wafers W. Increasing the height of the buffer station 4 with increasing number of wafers W entails an increase of the motion distance (up-down stroke) of the wafer transfer robot 5 in the height direction H. The increase in the up-down stroke increases the complexity of control of the wafer transfer robot 5. Enlarging the size of the wafer transfer robot 5 to enhance the strength of the wafer transfer robot 5 itself in order to support the increased up-down stroke leads to an increase in the size of the wafer transfer chamber 3 and the footprint (installation area). In one embodiment, FIG. 7 discloses the front surface 32 is perpendicular to the first side surface 31. The first front station 4*a* and the first rear station 4*b* are disposed along the first side surface 31.

Therefore, by taking into consideration the fact that the capacity of the buffer stations, one at each side, in a conventional EFEM 1 that handles 300-mm-diameter wafers is 25 wafers per buffer station, the EFEM 1 according to the present embodiment uses buffer stations 4 each of which can hold up to 25 wafers W so that the increase of the height dimension of the buffer stations 4 is minimized to the amount that allows for the increased wafer slot pitch. In addition, the up-down stroke of the wafer transfer robot 5 is chosen to be substantially the same as the stroke of a conventional wafer transfer robot or a value slightly greater than that. In the EFEM 1 of the present embodiment, four such buffer stations 4 in total are disposed at the same level on the side surfaces 31 of the wafer transfer chamber 3.

A buffer opening 4K that allows the wafer transfer robot 5 to access the loading unit 41 is formed in each buffer station 4 so that the hand 6 of the wafer transfer robot 5 can move between the inside 4S of the buffer station and the inside 3S of the wafer transfer chamber 3 through the buffer opening 4K. Each of the two buffer stations 4 next to each other in the front-rear direction A (the depth direction) is disposed in each of spaces 4S formed by partitioning, in the front-rear direction A, a common space enclosed by a buffer station front wall 46 and a buffer station rear wall 47 which are at substantially the same positions as the front wall 34 forming the front surface 32 of the wafer transfer chamber 3 and the rear wall 35 forming the rear surface 33 of the wafer transfer chamber 3, respectively, in the front-rear direction A and the a buffer station side wall 48 that connects one side edge of the buffer station front wall 46 with one side edge of the buffer station rear wall 47 (the side edges farther from the wafer transfer chamber 3) with a partition wall 49 projecting in the width direction B from the buffer station side wall 48 toward the wafer transfer chamber 3 to a predetermined distance.

In the present embodiment, the open edge of the buffer opening 4K of the buffer station 4 on the relatively front side (front buffer station 4) is formed by the side edge of the front wall 34 forming the front surface 32 of the wafer transfer chamber 3 and the protruding end of the partition wall 49 (the end closer to the wafer transfer chamber 3); the open edge of the buffer opening 4K of the buffer station 4 on the relatively rear side (the rear buffer station 4) is formed by the side edge of the rear wall 35 forming the rear surface 33 of the wafer transfer chamber 3 and the protruding end of the partition wall 49.

Figure 4:
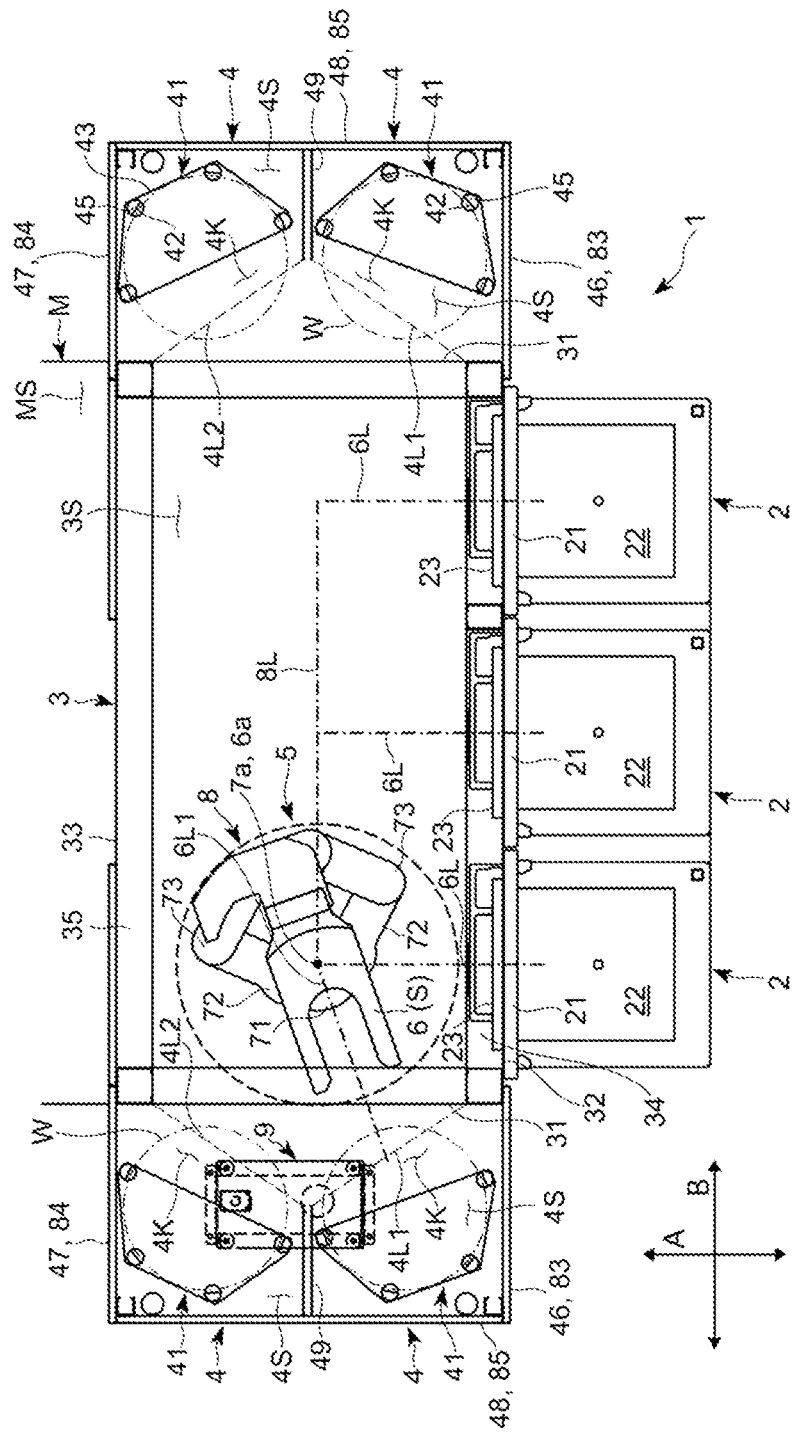
FIG. 4 is a diagram illustrating a state of the EFEM according to the embodiment in FIG. 1 in which the hand can access a front buffer station.

In the EFEM 1 according to the present embodiment, the position of the open edge of each buffer opening 4K, more specifically the position of the partition wall 49 (the position of the protruding end) is chosen so that the hand 6 and a wafer W does not come into contact with the open edge of the buffer opening 4K when wafers W can be loaded and unloaded to and from the buffer stations 4 by the wafer transfer robot 5. As illustrated in FIG. 4, the present embodiment uses the partition wall 49 whose protruding end does not reach the side surface 31 of the wafer transfer chamber 3. An imaginary line 4L1 that links the protruding end of the partition wall 49 with the side edge of the front wall 34 of the wafer transfer chamber 3 and an imaginary line 4L2 that links the protruding end of the partition wall 49 with the side edge of the rear wall 35 of the wafer transfer chamber 3 are longer than the diameter of the wafer W (in other words, the opening width of each buffer opening 4K is greater than the diameter of the wafer W).

The EFEM 1 according to the present embodiment is configured so that the hand 6 can move back and forth along the linear motion paths 6L1 and 6L2 between the motion start position (S) and the motion end position (E) at which the hand 6 reaches the inside 4S of the buffer station 4 through the opening 4K of each buffer station 4. In this way, wafers W can be loaded and unloaded to and from all of the four buffer stations 4 by the single wafer transfer robot 5 disposed in the wafer transfer chamber 3.

Figure 5:
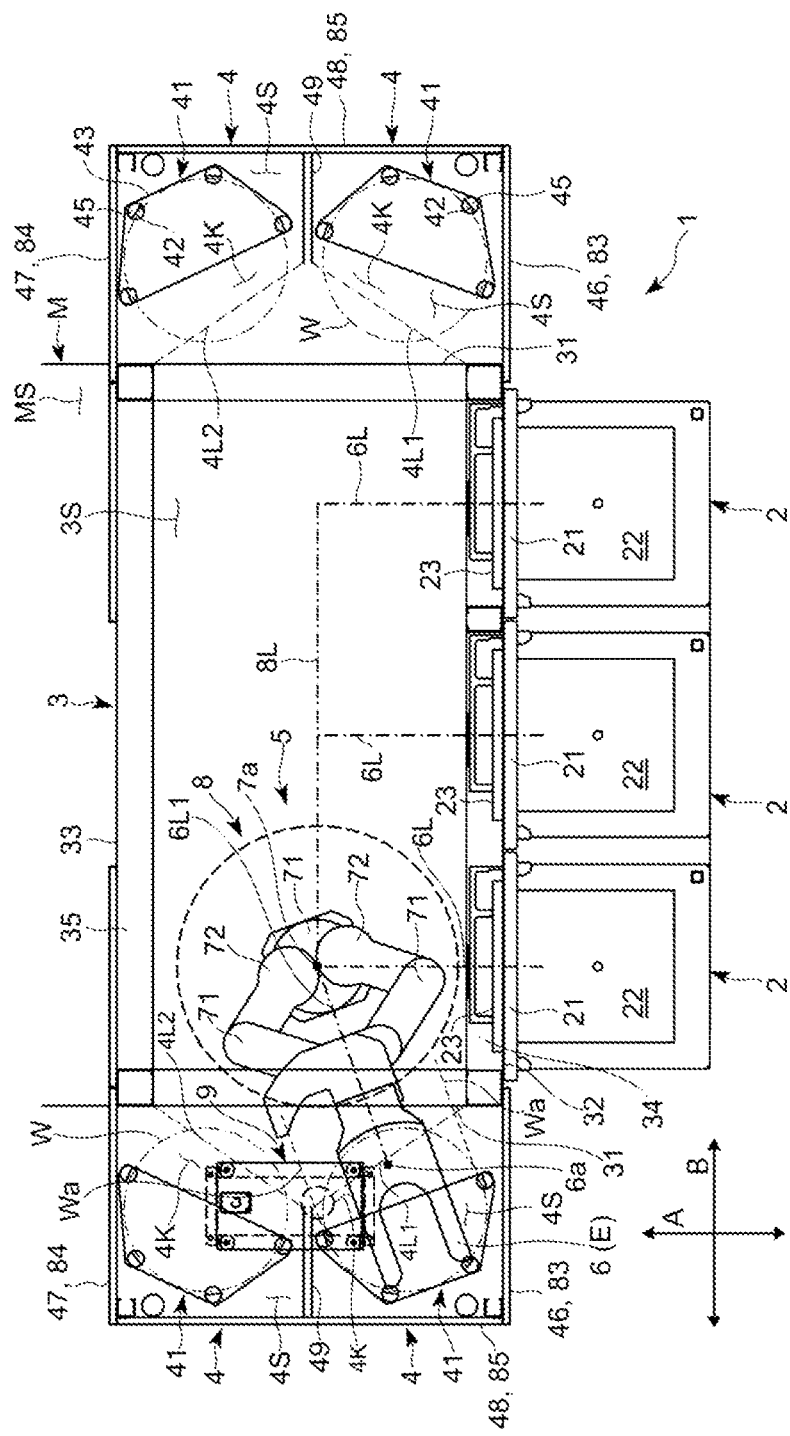
FIG. 5 is a diagram illustrating a state of the EFEM according to the embodiment in FIG. 4 in which the hand reaches the front buffer station.
Figure 6:
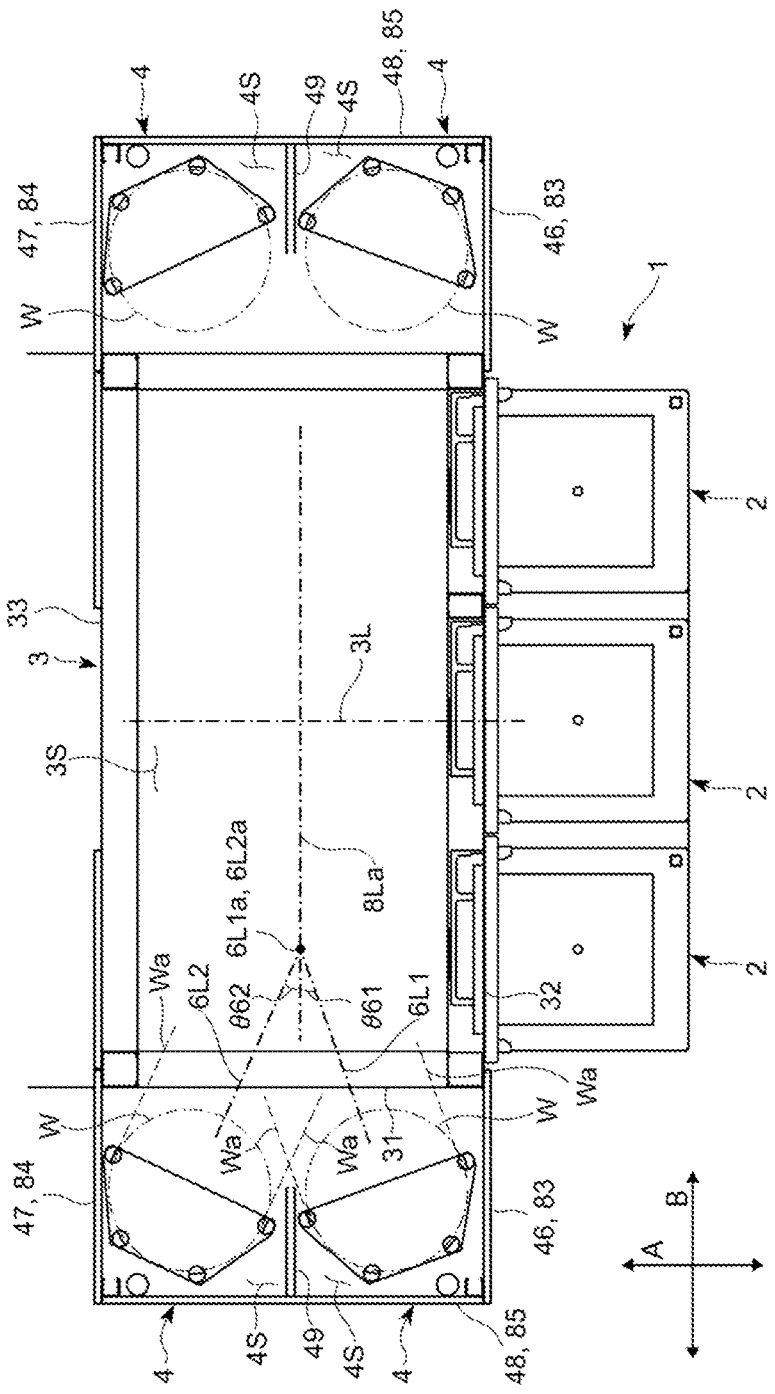
FIG. 6 is a diagram illustrating a motion path of the hand to each buffer station in the EFEM according to the embodiment.

Specifically, the EFEM 1 according to the present embodiment is configured so that the hand 6 of the wafer transfer robot 5 can move back and forth along the linear motion path 6L1 that extends from a predetermined position on the travel path 8L of the traveling part 8 toward the front one of the two buffer stations 4 disposed next to each other on a side surface 31 of the wafer transfer chamber 3, between the motion start position (S) indicated in FIG. 4 and the motion end position (E) indicated in FIG. 5, to load and unload wafers W to and from the buffer station 4. The motion path 6L1 along which the hand 6 can access the front buffer station 4 starts at the starting point 6L1a which is one end of the travel path 8L of the traveling part 8. As illustrated in FIG. 6, when an imaginary line 8La is drawn that is a linear line coinciding with the travel path 8L of the traveling part 8 and extending toward the side surface 31 of the wafer transfer chamber 3 beyond the starting point 6L1a of the motion path 6L1 of the hand 6, the imaginary line 8La crosses the motion path 6L1 of the hand 6 that extends from the starting point 6L1a toward the front buffer station 4. The crossing angle θ61 that opens to the side surface 31 of the wafer transfer chamber 3 is smaller than 90 degrees (an acute angle).

Figure 8:
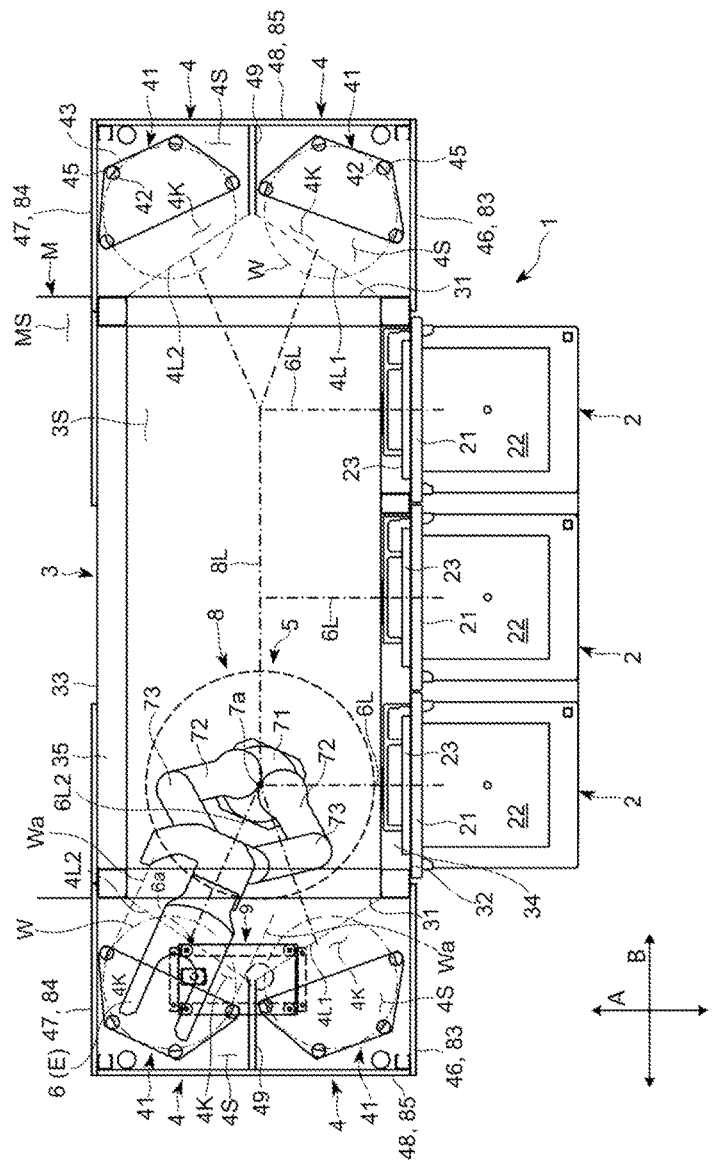
FIG. 8 is a diagram illustrating a state of the EFEM according to the embodiment in to FIG. 7 in which the hand reaches the rear buffer station.

Similarly, the EFEM 1 according to the present embodiment is configured so that the hand 6 of the wafer transfer robot 5 can move back and forth along the linear motion path 6L2 that extends from a predetermined position on the travel path 8L of the traveling part 8 toward the buffer station on the relatively rear side (the rear buffer station 4) out of the two buffer stations 4 disposed next to each other on the side surface 31 of the wafer transfer chamber 3, between the motion start position (S) indicated in FIG. 7 and the motion end position (E) indicated in FIG. 8, to load and unload wafers W to and from the buffer station 4. The motion path 6L2 of the hand 6 starts at the starting point 6L2a which is one end of the travel path 8L of the traveling part 8. That is, in the EFEM 1 of the present embodiment, the starting points of the motion paths 6L1 and 6L2 of the hand 6 to the front buffer station 4 and the rear buffer station 4 disposed next to each other in the front-rear direction are set at the same position on the travel path 8L of the traveling part 8. As illustrated in FIG. 6, when an imaginary line 8La is drawn that is a linear line coinciding with the travel path 8L of the traveling part 8 and extending toward the side surface 31 of the wafer transfer chamber 3 beyond the starting point 6L2a of the motion path 6L2 of the hand 6, the imaginary line 8La crosses the motion path 6L2 of the hand 6 that extends from the starting point 6L2a toward the rear buffer station 4. The crossing angle θ62 that opens to the side surface 31 of the wafer transfer chamber 3 is smaller than 90 degrees (an acute angle). In the present embodiment, the crossing angle θ62 is set to a given angle in the range from 19 degrees to 25 degrees, for example. The crossing angle θ62 is preferably the same as the crossing angle θ61 between the motion path 6L1 of the hand 6 to the front buffer station 4 and the imaginary line 8La described above. However, the crossing angles θ62 may differ from the crossing angle θ61.

In the present embodiment, the hand 6 is set so that when the traveling part 8 of the wafer transfer robot 5 is moved to a position at which a wafer W can be loaded to or unloaded from the FOUP on the load port 2 that is close to the side surface 31 of the wafer transfer chamber 3 (one of the load ports 2 on the both sides) among a plurality of (three in the example depicted) load ports 2 disposed side by side on the front surface 32 of the wafer transfer chamber 3, that is, a location facing the load port 2 in the front-rear direction A and the base end of the arm 7 (the arm base 71 in the present embodiment) is turned around the turning axis 7a predetermined degrees (the arm 7 is turned predetermined degrees with respect to the reference angle described above), the direction in which the hand 6 moves back and forth at the turning angle matches the motion paths 6L1 and 6L2 described above and the hand 6 can access the front buffer station 4 or the rear buffer station 4 disposed on the side surface 31 of the wafer transfer chamber 3. FIGS. 5, 6, 8 and 9 illustrate the trajectories Wa of the periphery of a wafer W held on the hand 6 when the hand 6 is moved along the motion paths 6L1 and 6L2.

Figure 9:
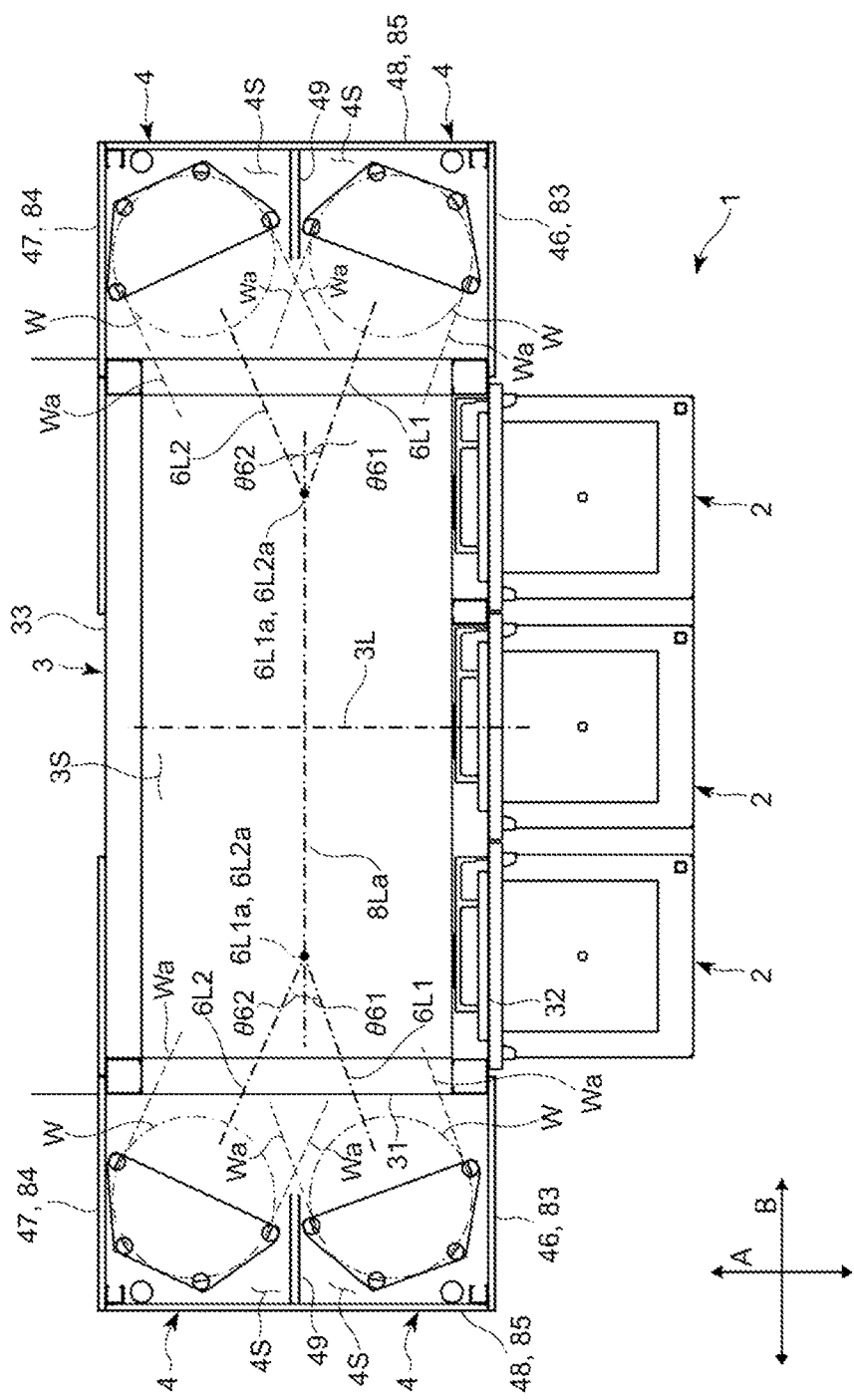
FIG. 9 is a diagram illustrating a motion path of the hand to each of the buffer stations in the EFEM according to the embodiment.

Note that, as illustrated in FIG. 9, the motion paths 6L1 and 6L2 of the hand 6 when wafers W are loaded and unloaded to and from the two buffer stations 4 disposed next to each other at the other side surface 31 (on the observer's right in FIGS. 4 to 9) of the wafer transfer chamber 3 are symmetrical to the motion paths 6L1 and 6L2 of the hand 6 when wafers W are loaded and unloaded to and from the two buffer stations 4 disposed next to each other on the side surface 31 of the wafer transfer chamber 3 described above with respect to a line 3L that passes through the center of the width of the wafer transfer chamber 3 and extends in the front-rear direction S (a line 3L that coincides with the motion path 6L of the hand 6 to the center load port 2 among the three load ports 2). That is, the starting points 6L1a and 6L2a of the motion path 6L1 of the hand 6 to the font buffer station 4 and the motion path 6L2 of the hand 6 to the rear buffer station 4 are at a common position on the travel path 8L of the traveling part 8. When the imaginary line 8La that coincides with the travel path 8L of the traveling part 8 described above is drawn, the crossing angle θ61 between the motion path 6L1 of the hand 6 from the starting point 6L1a toward the front buffer station 4 and the imaginary line 8La and the crossing angle θ62 between the motion path 6L2 of the hand 6 from the starting point 6L2a to the rear buffer station 4 and the imaginary line 8La are both an acute angle.

In the EFEM 1 of the present embodiment, an aligner 9 is provided on one of the side surfaces 31 of the wafer transfer chamber 3. The aligner 9 is an aligning device for placing a wafer W in a proper position on the hand 6 and may be any of known aligners. In the present embodiment, the aligner 9 is disposed in an aligner placement space 9S provided in a region on the side surface 31 of the wafer transfer chamber 3 that is below the two buffer stations 4 disposed next to each other in the front-rear direction A. In the EFEM 1 of the present embodiment, the aligner placement space 9S is formed that is enclosed by an aligner top wall 91 and an aligner bottom wall 92 opposed to each other in the height direction H at least below the bottom wall 44 of the buffer stations 4 (buffer station bottom wall 44), an aligner front wall 93, an aligner rear wall 94 and an aligner side wall 95 that are contiguous with the buffer station front wall 46, the buffer station rear wall 47, and the buffer station side wall 48, respectively, and extend to the aligner bottom wall 92. The aligner 9 is placed on the aligner bottom wall 92. In the present embodiment, aligner placement spaces 9S are formed on both side surfaces 31 of the wafer transfer chamber 3 and the aligner 9 is disposed in one of the aligner placement spaces 9S.

Usage and operations of the EFEM 1 thus configured will now be described.

First, an FOUP is transferred to a load port 2 and placed on the table 22 by an FOUP carrier such as an OHT, not depicted. Positioning projections, for example, provided on the table 22 fit into positioning recesses in the FOUP to allow the FOUP to be placed in a predetermined proper position on the table 22. In the present embodiment, an FOUP can be placed on the table 22 of each of the three load ports 2 disposed side by side in the width direction B of the wafer transfer chamber 3. A presence sensor (not shown) for detecting whether the FOUP is placed in a predetermined position on the table may detect whether the FOUP is placed in the proper position on the table 22.

Then the EFEM 1 according to the present invention performs a bottom purge to reduce the concentration of moisture and the concentration of oxygen, for example, in the FOUP to predetermined values or lower in a short time, thereby changing the ambient environment around the wafers W in the FOUP to a lower humidity and lower oxygen environment than before the bottom purge. Then the door of the FOUP is opened with the door part 23 of the load port 2 to cause the interior space of the FOUP to communicate with the interior space 3S of the wafer transfer chamber 3 and wafers W in the FOUP are delivered into the inside 3S of the wafer transfer chamber 3 one after another by the wafer transfer robot 5 disposed in the in the inside 3s. Here, as illustrated in FIGS. 1 and 3, the traveling part 8 is moved to the location facing the load port 2 in the front-rear direction A of the wafer transfer chamber 3 and the wafer transfer robot 5 linearly moves the hand 6 back and forth along the motion path 6L parallel to the front-rear direction A of the wafer transfer chamber 3 (in other words, the direction perpendicular to the travel path 8L of the traveling part 8) between the motion start position (S) and the motion end position (E) at which the hand 6 reaches the inside of the FOUP, thereby wafers W can be taken from the FOUP into the wafer transfer chamber 3.

Then, the EFEM 1 of the present embodiment uses the wafer transfer robot 5 to place the wafer W taken from the FOUP on the port of the wafer processing equipment (specifically the load lock chamber), or transfer the wafer W to the loading unit 41 of the buffer station 4 and place the wafer W in the loading unit 41 with the periphery of the wafer W inserted into and held with the wafer holding slots 42, or transfer the wafer W to the aligner 9.

In the present embodiment, an opening that communicates with the inside MS of the wafer processing equipment (for example inside the load lock chamber, not depicted) is formed in the central portion in the width direction in the rear wall 35 of the wafer transfer chamber 3. The traveling part 8 of the wafer transfer robot 5 is positioned in a location facing the opening in the front-rear direction A of the wafer transfer chamber 3 (the location is the same location that faces the center load port 2 among the plurality of load ports 2 disposed side by side in the width direction B) and the hand 6 is linearly moved back and forth along the motion path 6L parallel to the front-rear direction A of the wafer transfer chamber 3 between the motion start point (S) and the motion end point (E) at which the hand 6 reaches the inside MS of the semiconductor processing equipment. In this way, wafers W can be transferred between the wafer transfer chamber 3 and the wafer processing equipment M.

When wafers W are loaded and unloaded to and from the aligner 9, the traveling part 8 of the wafer transfer robot 5 is positioned in a location facing the load port 2 that is closest to the aligner 9 among the plurality of load ports 2 disposed side by side in the width direction B (the load port 2 on the observer's left in FIG. 1 and other figures) and the hand 6 is linearly moved back and forth between the motion start position (S) and the motion end point (E) at which the hand 6 reaches the aligner 9 along the width direction B of the wafer transfer chamber 3. In this way, the wafers W can be transferred between the wafer transfer chamber 3 and the aligner 9.

The EFEM 1 of the present embodiment stops the traveling part 8 of the wafer transfer robot 5 at a location facing the load port 2 at either of the sides in the front-rear direction A of the wafer transfer chamber 3 among the plurality of (three in the example depicted) load ports 2 disposed side by side, horizontally turns the folded entire arm 7 around the turning axis 7a to the angle at which the direction in which the hand 6 moves back and forth is aligned with the motion path 6L1 to the front buffer station 4 or the motion path 6L2 to the rear buffer station 4, and linearly moves the hand 6 back and forth between the motion start position (S) and the motion end point (E) at which the hand 6 reaches the inside 4S of the buffer station. In this way, wafers W can be transferred between the wafer transfer chamber 3 and each of the buffer stations 4.

The EFEM 1 of the present embodiment takes wafers W that underwent an appropriate process by the semiconductor processing equipment M from the semiconductor processing equipment M and directly stores the wafers W into the FOUP or places the wafers W in the buffer station 4 then into the FOUP one by one by the wafer transfer robot 5. When there is no longer unprocessed wafers W left in the FOUP and all the wafers W in the FOUP are wafers W processed by the semiconductor processing equipment M, the door part 23 of the load port 2 in close contact with the door of the FOUP is moved from open position to a close position to close the opening of the load port 2 and the load/unload opening of the FOUP. Then the FOUP on the table 22 is delivered to the next process step by an FOUP transfer mechanism, not depicted.

In this way, the EFEM 1 of the present embodiment implements a configuration capable of holding many wafers W in buffer stations 4 by employing a novel layout in which two buffer stations 2 are disposed next to each other in the front-rear direction A at the a side surface 31 of the wafer transfer chamber 3 rather than by enlarging the space for holding wafers W in the height direction H of the buffer stations 4. Accordingly, the holding space in the buffer stations 4 does not need to be increased in the height direction H or the up-down stroke distance of the wafer transfer robot 5 does not need to be increased from conventional up-down stroke distances as the number of wafer W to hold increases. Thus, an increase of the sizes of the wafer transfer chamber 3 and the wafer transfer robot 5 can be avoided.

Furthermore, in the EFEM 1 according to the present embodiment, the size of each of the two buffer stations 4 disposed next to each other at a side surface 31 of the wafer transfer chamber 3 can be chosen to be the same or substantially the same as the size of a known buffer station. The wafer transfer robot 5 and the wafer transfer chamber 3 can be those confirming to known specifications. This is advantageous over configurations that increase the height dimension of buffer stations 4 in order to hold more wafers. In particular, the present embodiment in which each of the four buffer stations 4 can hold up to 25 wafers W can hold up to 100 wafers in the buffer stations 4 in total in the whole EFEM 1.

Further, in the EFEM 1 of the present embodiment, wafers W can be transferred into the four buffer stations 4 disposed at the same level or wafers W can be taken from each buffer station 4 and transferred to a predetermined destination (the inside MS of the wafer processing equipment, the FOUP, or the aligner 9) by the single wafer transfer robot 5 disposed in the inside 3S of the wafer transfer chamber 3. Accordingly, the number of transfer robot 5 does not need to be increased with the number of buffer stations 4 and a significant increase of cost associated with an increased number of transfer robots 5.

In the EFEM 1 according to the present embodiment, two buffer stations 4 are disposed next to each other at a side surface 31 of the wafer transfer chamber 3. This is because a layout in which three or more buffer stations are disposed next to each other at a side surface 31 of the wafer transfer chamber 3 enlarges the installation space of the buffer stations 4 in the front-rear direction A, which leads to an increase of the footprint of the whole EFEM 1 and the complexity of control of loading and unloading the wafer W by the common wafer transfer robot 5 and handling of the cables associated by the wafer transfer robot 5 for each of the three or more buffer stations 4. Therefore such a layout is unfavorable in terms of practicality as compared with the layout in which two buffer stations 4 are disposed at a side surface 31 of the wafer transfer chamber 3.

In particular, the EFEM 1 according to the present embodiment uses a wafer transfer robot 5 having an arm 7 capable of moving back and forth a hand 6 attached to one end, and a traveling part 8 that turnably supports the base end of the arm 7 and travels in the width direction B of the wafer transfer chamber 3. The hand 6 moves back and forth along the linear motion paths 6L1 and 6L2 from the starting points 6L1a and 6L2a on the travel path 8L of the traveling part 8 to the front buffer station 4 and the rear buffer station 4 disposed next to each other in the front-rear direction A at a side surface 31 of the wafer transfer chamber 3, thereby the hand 6 can reach the buffer stations 4. This configuration can reduce the motion distance of the hand 6, therefore can reduce the time required for loading/unloading wafers W to and from the buffer stations 4 (reduce the takt time), and consequently improve the efficiency of wafer handling, as compared with a configuration in which the hand 6 of the wafer transfer robot 5 moves along a linear motion path along the front-back direction A (the depth direction) of the wafer transfer chamber 3 and a liner motion path parallel to the travel path 8L of the traveling part 8 in turn when the hand 6 of the wafer transfer robot 5 accesses the buffer stations 4.

In addition, in the EFEM 1 of the present embodiment, the motion paths 6L1 and 6L2 of the hand 6 to the two buffer stations 4 disposed next to each other in the front-rear direction A are at a predetermined angle to the travel path 8L of the traveling part 8 rather than in parallel to the travel path 8L. Accordingly, as illustrated in FIG. 1 and other figures, the wafer W holding location in the front buffer station 4 can be set such that the periphery of a wafer W is positioned further forward than the inner surface of the front wall 34 of the wafer transfer chamber 3 (the surface facing the center of the wafer transfer chamber 3 in the front-rear direction A) and the wafer W holding location in the rear buffer station 4 can be set such that the periphery of a wafer W is positioned further rearward than the inner surface of the rear wall 35 of the wafer transfer chamber 3 (the surface facing the center in the front-rear direction A). In this mode, the distance between the inner surfaces of the front wall 34 and the rear wall 35, which determines the depth dimension of the inner space 3S of the wafer transfer chamber 3, can be chosen to be relatively small as compared with that in a mode in which the orientation of the buffer opening 4K of each buffer station 4 is in parallel to the travel path 8L of the traveling part 8 and the hand 6 moves along a linear motion path that is parallel to the travel path 8L.

In the EFEM 1 of the present embodiment, the starting points 6L1a and 6L2a of the motion paths 6L1 and 6L2 of the hand 6 to the buffer stations 4 disposed next to each other in the front-rear direction A are set at the same position on the travel path 8L of the traveling part 8. Accordingly, the traveling part 8 of the wafer transfer robot 5 can be positioned in the common location when wafers W are loaded to or unloaded from the front buffer station 4 and the rear buffer station 4 disposed at the same side surface 31 of the wafer transfer chamber 3. This mode can improve the efficiency of control of wafer transfer robot 5 as compared with a mode in which the location of the traveling part 8 when wafers are loaded to or unloaded from the front buffer station 4 differs from the location of the traveling part 8 when wafers are loaded to or unloaded from the rear buffer station 4. Furthermore, in the EFEM 1 of the present embodiment, the motion distance of the hand 6 when a wafer W is loaded to or unloaded from the front buffer station 4 (which is equivalent to the motion path 6L1) and the motion distance of the hand 6 when a wafer W is loaded to or unloaded from the rear buffer station 4 (which is equivalent to the motion path 6L2) are the same or substantially the same. This also contributes to simplification (improvement of the efficiency) of control of the wafer transfer robot 5.

In addition, in the EFEM 1 of the present embodiment, the angle at which the motion paths 6L1 and 6L2 of the hand 6 to the two buffer stations disposed next to each other in the front-rear direction A cross each other on the travel path 8L of the traveling part 8 (the angle equal to "θ61" plus "θ62" in FIG. 6) is set to a predetermined acute angle (for example less than or equal to 45 degrees). This mode can prevent a significant increase in the dimension in the front-rear direction (the depth dimension) required for disposing the two buffer stations 4 in the front-rear direction A as compared with a mode in which the motion path of the hand 6 to the front buffer station 4 and the motion path of the hand 6 to the rear buffer station 4 cross on the travel path 8L of the traveling part 8 at an angle greater than 90 degrees.

Furthermore, in the EFEM 1 according to the present embodiment, one aligner 9 is disposed in such a location that the aligner 9 does not increase footprint of the two buffer stations disposed next to each other on one of the side surfaces 31 of the wafer transfer chamber 3 and does not interfere with the two buffer stations 4. The aligner 9 can be used to perform center alignment of wafers W. In addition, in the EFEM 1 according to the present embodiment, the height positions of all of the buffer stations 4 can be set at the same level even in the configuration in which the aligner 9 is provided.

The present invention is not limited to the embodiment described above. For example, while wafers with a diameter of 450 mm are used in the embodiment described above, wafers that can be handled in the EFEM according to the present invention are not limited to wafers of this size; wafers with other diameters can be handled. Since a smaller wafer diameter makes it possible to choose a smaller wafer slot pitch, the height of each buffer station can be reduced by an amount of reduction of the wafer slot pitch, given that the number of wafers that the buffer station can hold is the same.

The starting points of the motion paths of the hand to the two buffer stations disposed next to each other in the front-rear direction may be at different positions on the straight line that coincides the travel path of the traveling part (equivalent to 8La described above). That is, in the EFEM of the present invention, one may choose a setting where the intersection of the straight line that coincides with the motion path of the hand to the front buffer station and the straight line that coincides with the travel path of the traveling section does not coincide with the intersection of the motion path of the hand to the rear buffer station and the straight line that coincides with the travel path of the traveling part.

While a single transfer robot disposed in the wafer transfer chamber is used to load and unload wafers to and from all of the buffer stations in the embodiment described above, a plurality of wafer transfer robots (the number of wafer transfer robots may be the same as or different from the number of buffer stations) may be used to load and unload wafers to and from the buffer stations.

Furthermore, any of various types of wafer transfer robots may be used, including the one that is configured to be able to move a hand only along two axes in the front-rear direction and the width direction of the wafer transfer chamber that intersect at right angles.

The aligner in the EFEM of the present invention may be disposed at any one of the sides of the wafer transfer chamber. Accordingly, in the configuration in which two buffer stations are disposed next to each other only on one of the side surfaces of the wafer transfer chamber, the aligner may be disposed at the same side of the wafer transfer chamber at which the buffer stations are disposed or may be disposed at the other side (the side at which buffer stations are not disposed).

While the height positions of the buffer stations are preferably at the same level, the height positions may be chosen to be different by taking consideration the location of the aligner.

The capacity of each buffer station may be other than 25 wafers.

Furthermore, a single load port or a plurality of load ports may be disposed on the front surface of the wafer transfer chamber.

Other components are also not limited to specific configurations in the embodiment described above. Various modifications can be made without departing from the spirit of the present invention.

What is claimed is:

1. An EFEM, equipment front end module, comprising:
   a wafer transfer chamber having an interior space, a plan view of the wafer transfer chamber having a front surface, a rear surface, a first side surface and a second side surface, the first side surface opposite to the second side surface, the front surface and the rear surface located in a front-rear direction, the first side surface and the second side surface located in a width direction, the front-rear direction perpendicular to the width direction, the front surface perpendicular to the first side surface;
   a wafer transfer robot solely disposed inside the interior space of the wafer transfer chamber;
   a travel path solely disposed inside the interior space of the wafer transfer chamber along the width direction;
   a load port disposed adjacent to the front surface of the wafer transfer chamber; and
   a first front station disposed inside the interior space of the wafer transfer chamber and,
   a first rear station disposed inside the interior space of the wafer transfer chamber and, wherein the first front station and the first rear station are disposed along the first side surface in the front-rear direction, wherein the first front station and the first rear station are capable of temporarily storing wafers,
   a semiconductor processing equipment disposed adjacent to the rear surface of the wafer transfer chamber; and
   wherein the wafer transfer robot comprises:
      a hand;
      an arm capable of moving back and forth the hand, and
      a traveling part turnably supporting a base end of the arm, the traveling part traveling along the travel path such that when the wafer transfer robot is located at a first position of the travel path, the hand moves to reach the first front station along a first linear motion path, or when the wafer transfer robot is located at a second position of the travel path, the hand moves to reach the first rear station along a second linear motion path,
   wherein the travel path, the first linear motion path and the second linear motion path satisfy the following relationship:
      a first crossing angle formed between the travel path and the first linear motion path is acute,
      a second crossing angle formed between the travel path and the second linear motion path is acute,
   a sum of the first crossing angle and the second crossing angle is acute,
      wherein the first front station and the first rear station are disposed equidistant from a point on the travel path.

2. The EFEM according to claim 1, further comprising:
   a second front station disposed on the second side surface; and
   a second rear station disposed on the second side surface, wherein the second front station and the second rear station are disposed in the front-rear direction, wherein the second front station and the second rear station are capable of temporarily storing wafers.

3. The EFEM according to claim 1, wherein the first position of the travel path is the same as the second position of the travel path,
   wherein the wafer transfer robot travels from the first position closer to the first side surface to a third position closer to the second side surface along the width direction.

4. The EFEM according to claim 1, wherein the first position of the travel path is different from the second position of the travel path,
   wherein the wafer transfer robot travels from the first or second position closer to the first side surface to a third position closer to the second side surface along the width direction.

5. The EFEM according to claim 1, wherein the first position and the second position are the same, and wherein when the wafer transfer robot is located at the first position of the travel path, the hand can move to reach the first front station, the first rear station and the front port.

6. The EFEM according to claim 1, wherein the arm comprises link elements such that the arm provided on the travelling part on the travel path is extendable to reach the first front station and the first rear station.

7. A wafer transfer chamber, comprising:
   an interior space, a plan view of the wafer transfer chamber having a front surface, a rear surface, a first side surface and a second side surface, the first side surface opposite to the second side surface, the front surface and the rear surface located in a front-rear direction, the first side surface and the second side surface located in a width direction, the front-rear direction perpendicular to the width direction, the front surface perpendicular to the first side surface,
   a wafer transfer robot solely disposed inside the interior space of the wafer transfer chamber;
   a travel path solely disposed inside the interior space of the wafer transfer chamber along the width direction;
   a load port disposed adjacent to the front surface of the wafer transfer chamber; and
   a first front station disposed inside the interior space of the wafer transfer chamber and,
   a first rear station disposed inside the interior space of the wafer transfer chamber and, wherein the first front station and the first rear station are disposed along the first side surface in the front-rear direction, wherein the first front station and the first rear station are capable of temporarily storing wafers,
wherein the wafer transfer robot comprises:
  a hand;
  an arm capable of moving back and forth the hand, and
  a traveling part turnably supporting a base end of the arm, the traveling part traveling along the travel path such that when the wafer transfer robot is located at a first position of the travel path, the hand moves to reach the first front station along a first linear motion path, or when the wafer transfer robot is located at a second position of the travel path, the hand moves to reach the first rear station along a second linear motion path,
wherein the travel path, the first linear motion path and the second linear motion path satisfy the following relationship:
  a first crossing angle formed between the travel path and the first linear motion path is acute,
  a second crossing angle formed between the travel path and the second linear motion path is acute,
a sum of the first crossing angle and the second crossing angle is acute,
  wherein the first front station and the first rear station are disposed equidistant from a point on the travel path.

8. The wafer transfer chamber according to claim 7 further comprising,
  a front wall including the front surface has a first inner surface opposite to the front surface,
  a rear wall including the rear surface has a second inner surface opposite to the rear surface;
  wherein a front edge of the wafer when held in the first front station in the front-rear direction is located in a position in front of a first line extended from the first inner surface and behind a second line extended from the front surface,
  wherein a rear edge of the wafer when held in the first rear station in the front-rear direction is located in a position behind a third line extended from the second inner surface, and in front of a fourth line extended from the rear surface.

9. The wafer transfer chamber according to claim 7 further comprising,
  a front wall including the front surface has a first inner surface opposite to the front surface,
  a rear wall including the rear surface has a second inner surface opposite to the rear surface;
  a first loading unit disposed in the first front station, wherein a front edge of the first loading unit in the front-rear direction is located in a position in front of a first line extended from the first inner surface and behind a second line extended from the front surface; and
  a second loading unit disposed in the first rear station, wherein a rear edge of the second loading unit in the front-rear direction is located in a position behind a third line extended from the second inner surface, and in front of a fourth line extended from the rear surface.

10. The wafer transfer chamber according to claim 7, wherein the first position of the travel path is the same as the second position of the travel path,
  wherein the wafer transfer robot travels from the first position closer to the first side surface to a third position closer to the second side surface along the width direction.

11. The wafer transfer chamber according to claim 7, wherein the first position of the travel path is different from the second position of the travel path,
  wherein the wafer transfer robot travels from the first or second position closer to the first side surface to a third position closer to the second side surface along the width direction.

12. The wafer transfer chamber according to claim 7, wherein the first position and the second position are the same, and wherein when the wafer transfer robot is located at the first position of the travel path, the hand can move to reach the first front station, the first rear station and the front port.

13. The wafer transfer chamber according to claim 7, wherein the arm comprises link elements such that the arm provided on the travelling part on the travel path is extendable to reach the first front station and the first rear station.

14. An EFEM, equipment front end module, comprising:
  a wafer transfer chamber having an interior space, a plan view of the wafer transfer chamber having a front surface, a rear surface, a first side surface and a second side surface, the first side surface opposite to the second side surface, the front surface and the rear surface located in a front-rear direction, the first side surface and the second side surface located in a width direction, the front-rear direction perpendicular to the width direction, the front surface perpendicular to the first side surface;
  a wafer transfer robot solely disposed inside the interior space of the wafer transfer chamber;
  a travel path solely disposed inside the interior space of the wafer transfer chamber along the width direction;
  a load port disposed adjacent to the front surface of the wafer transfer chamber; and
  a first front station disposed inside the interior space of the wafer transfer chamber and,
  a first rear station disposed inside the interior space of the wafer transfer chamber and, wherein the first front station and the first rear station are disposed along the first side surface in the front-rear direction, wherein the first front station and the first rear station are capable of temporarily storing wafers,
  a semiconductor processing equipment disposed adjacent to the rear surface of the wafer transfer chamber; and
wherein the wafer transfer robot comprises:
  a hand;
  an arm capable of moving back and forth the hand, and
  a traveling part turnably supporting a base end of the arm, the traveling part traveling along the travel path such that when the wafer transfer robot is located at a first position of the travel path, the hand moves to reach the first front station along a first linear motion path, or when the wafer transfer robot is located at a second position of the travel path, the hand moves to reach the first rear station along a second linear motion path,
wherein the travel path, the first linear motion path and the second linear motion path satisfy the following relationship:
  a first crossing angle formed between the travel path and the first linear motion path is acute,
  a second crossing angle formed between the travel path and the second linear motion path is acute,
a sum of the first crossing angle and the second crossing angle is acute,
  wherein a turning axis of the arm and a hand reference point are both arranged on the travel path, the hand reference point coinciding with the turning axis of the arm in a plan view of the hand at a motion start position when the arm is folded.

15. A wafer transfer chamber, comprising:
an interior space, a plan view of the wafer transfer chamber having a front surface, a rear surface, a first side surface and a second side surface, the first side surface opposite to the second side surface, the front surface and the rear surface located in a front-rear direction, the first side surface and the second side surface located in a width direction, the front-rear direction perpendicular to the width direction, the front surface perpendicular to the first side surface,
a wafer transfer robot solely disposed inside the interior space of the wafer transfer chamber;
a travel path solely disposed inside the interior space of the wafer transfer chamber along the width direction;
a load port disposed adjacent to the front surface of the wafer transfer chamber; and
a first front station disposed inside the interior space of the wafer transfer chamber and,
a first rear station disposed inside the interior space of the wafer transfer chamber and, wherein the first front station and the first rear station are disposed along the first side surface in the front-rear direction, wherein the first front station and the first rear station are capable of temporarily storing wafers,
wherein the wafer transfer robot comprises:
a hand;
an arm capable of moving back and forth the hand, and
a traveling part turnably supporting a base end of the arm, the traveling part traveling along the travel path such that when the wafer transfer robot is located at a first position of the travel path, the hand moves to reach the first front station along a first linear motion path, or when the wafer transfer robot is located at a second position of the travel path, the hand moves to reach the first rear station along a second linear motion path,
wherein the travel path, the first linear motion path and the second linear motion path satisfy the following relationship:
a first crossing angle formed between the travel path and the first linear motion path is acute,
a second crossing angle formed between the travel path and the second linear motion path is acute,
a sum of the first crossing angle and the second crossing angle is acute,
wherein a turning axis of the arm and a hand reference point are both arranged on the travel path, the hand reference point coinciding with the turning axis of the arm in a plan view of the hand at a motion start position when the arm is folded.

* * * * *